US010861545B2

(12) United States Patent
Dalgaty et al.

(10) Patent No.: US 10,861,545 B2
(45) Date of Patent: Dec. 8, 2020

(54) PROGRAMMABLE ARTIFICIAL NEURON AND ASSOCIATED PROGRAMMING METHOD

(71) Applicant: COMMISSARIAT A L'ENERGIE ATOMIQUE ET AUX ENERGIES ALTERNATIVES, Paris (FR)

(72) Inventors: Thomas Dalgaty, Grenoble (FR); Elisa Vianello, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/527,974

(22) Filed: Jul. 31, 2019

(65) Prior Publication Data

US 2020/0043552 A1 Feb. 6, 2020

(30) Foreign Application Priority Data

Aug. 1, 2018 (FR) ..................................... 18 57210

(51) Int. Cl.
*G11C 13/00* (2006.01)
*G06N 3/04* (2006.01)

(52) U.S. Cl.
CPC ......... *G11C 13/0069* (2013.01); *G06N 3/049* (2013.01); *G11C 13/0004* (2013.01); *G11C 13/0007* (2013.01); *G11C 13/0011* (2013.01); *G11C 13/0061* (2013.01); *G11C 2013/0071* (2013.01)

(58) Field of Classification Search
None
See application file for complete search history.

(56) References Cited

U.S. PATENT DOCUMENTS

2012/0005141 A1* 1/2012 Sasagawa .............. G06N 3/063 706/25
2015/0106316 A1* 4/2015 Birdwell ................ G06N 3/063 706/33

FOREIGN PATENT DOCUMENTS

CN 102496385 A 6/2012
EP 3 133 535 A1 2/2017

OTHER PUBLICATIONS

Zheng, L., et al., "Memristor-based Synapses and Neurons for Neuromorphic Computing," 2015 IEEE International Symposium on Circuits and Systems.*

(Continued)

*Primary Examiner* — Muna A Techane
(74) *Attorney, Agent, or Firm* — Pillsbury Winthrop Shaw Pittman LLP

(57) ABSTRACT

A programmable artificial neuron emitting an output signal controlled by at least one control parameter, includes, for each control parameter, a capacitor and at least one block including at least one multiplexer configured to be in two states: a programming state and an operating state; a transistor; and a non-volatile resistive random access memory connected in series with the transistor, the capacitor and the resistive random access memory being mounted in parallel. The multiplexer is configured to, when it is in the programming state, set a resistance value of the resistive random access memory to set the value of the control parameter; when it is in the operating state, conserve the set resistance value of the resistive random access memory.

7 Claims, 4 Drawing Sheets

(56) References Cited

OTHER PUBLICATIONS

Grossi, A., et al., “Experimental Investigation of 4-kb RRAM Arrays Programming Conditions Suitable forTCAM,” IEEE Transactions on Very Large Scale Integration (VLSI) Systems, vol. 26, No. 12, Mar. 2018, XP011702475, pp. 2599-2607.*
Search Report as issued in French Patent Application No. 1857210, dated Apr. 15, 2019.
Dalgaty, T., et al., “Insect-Inspired Elementary Motion Detection Embracing Resistive Memory and Spiking Neural Networks,” 11$^{th}$ International Conference, Image Analysis and Recognition, Jul. 2018, XP047477999, pp. 115-128.
Kwon, M. W., et al. “Integrate-and-Fire (I&F) Neuron Circuit Using Resistive-Switching Random Access Memory (RRAM),” Journal of Nanoscience and Nanotechnology, vol. 17, No. 5, May 2017, XP055474211, pp. 3038-3041.
Shin, S., et al., “Neuronal Spike Event Generation by Memristors,” 13$^{th}$ International Workshop on Cellular Nanoscale Networks and Their Applications, Aug. 2012, XP032253872, pp. 1-4.
Zheng, L., et al., “Memristor-based Synapses and Neurons for Neuromorphic Computing,” 2015 IEEE International Symposium on Circuits and Systems, May 2015, XP033183327, pp. 1150-1153.
Indiveri, G., et al, “Neuromorphic silicon neuron circuits,” Frontiers in Neuroscience, vol. 5, Jan. 2011, XP055081025, pp. 1-23.

* cited by examiner

PROGRAMMABLE ARTIFICIAL NEURON AND ASSOCIATED PROGRAMMING METHOD

CROSS-REFERENCE TO RELATED APPLICATIONS

This application claims priority to French patent application number 1857210, filed Aug. 1, 2018. The content of this application is incorporated herein by reference in its entirety.

TECHNICAL FIELD OF THE INVENTION

The technical field of the invention is that of artificial neurons and more specifically that of programmable artificial neurons.

The present invention relates to an artificial neuron and in particular a programmable artificial neuron. The present invention also relates to a method for programming a programmable artificial neuron.

TECHNOLOGICAL BACKGROUND OF THE INVENTION

In the field of information and communication technologies, artificial neural networks are the subject of great interest. An artificial neural network is inspired by the operation of the human brain and includes a plurality of artificial neurons connected together through artificial synapses.

An artificial neuron may be implemented by an electric circuit having for input one or more synaptic connections through which propagate signals coming from other artificial neurons. As a function of the incoming signals, the artificial neuron propagates or not a pulse at its output.

Numerous models of artificial neurons exist. One of the best known is the artificial neuron of LIF (Leaky Integrate and Fire) type. An LIF type artificial neuron integrates a charge at the input, dissipates it over time and emits a pulse when the integrated charge is greater than a predetermined threshold.

The behaviour of an LIF type artificial neuron is governed by several parameters such as for example a time constant defining the rate at which the artificial neuron charges, a refractory period defining the minimum period between two emissions of pulses or instead a spike frequency adaptation behaviour. This latter parameter corresponds to the decrease in the pulse emission frequency when the artificial neuron is subjected to a step signal, as illustrated in FIG. 1.

Conventionally, an LIF type artificial neuron is implemented by CMOS technology which makes it possible to adjust the parameters of the LIF type artificial neuron by polarisation of the MOS transistor. For example, FIG. 2 illustrates a simplified LIF type artificial neuron in which only the time constant is adjusted.

At the arrival of an input signal modelled by a current source Iin, a capacitor Cmem charges at a rate depending on the drain-source resistance of a transistor M1 to which it is connected in parallel. The capacitor Cmem is also connected in parallel to a transistor M2 and a transistor M3 and the voltage Vmem at its terminals supplies the non-inverting input of an operational amplifier. The output of the operational amplifier is connected to a first inverter 11, itself connected to a second inverter 12. When the voltage Vmem at the terminals of the capacitor Cmem is greater than a threshold voltage Vthr, the output of the operational amplifier increases until reaching the supply voltage Vdd. The output of the first inverter 11 then decreases until reaching a zero voltage and, thanks to a positive feedback by opening the channel of the transistor M3, the voltage at the input of the artificial neuron increases more rapidly and makes it possible to accelerate the charging of the capacitor Cmem. Simultaneously, the output of the second inverter 12 increases until reaching the supply voltage Vdd, constituting the rising edge of the output pulse. However, when the voltage at the output of the second inverter 12 increases, it opens the channel of the transistor M2 and the voltage Vmem at the terminals of the capacitor Cmem discharges rapidly in such a way that the input voltage returns to zero. The pulse then ceases. The discharge of the capacitor Cmem is carried out by polarising the transistor M1 via the voltage Vlk, a voltage below the threshold voltage Vthr, such that the drain-source resistance Rds of the transistor M1 is sufficiently high so that the capacitor Cmem discharges relatively slowly through the transistor M1. Thus, the circuit of FIG. 2 indeed reproduces the behaviour of an LIF type artificial neuron with a certain time constant adjusted by the capacitance of the capacitor Cmem and by the drain-source resistance Rds of the transistor M1 which varies with its gate voltage Vlk.

An LIF type artificial neuron implemented by CMOS technology and of which the behaviour is regulated by several parameters is illustrated in FIG. 3. The part P1 of the circuit makes it possible to adjust a time constant by the capacitance of a capacitor Cmem2 and by the drain-source resistance of a transistor ML3 which varies with its gate voltage Vlk, the part P2 of the circuit makes it possible to adjust a refractory period by the capacitance of a capacitor CR and the drain-source resistance of a transistor MR5 which varies with its gate voltage Vref and the part P3 of the circuit makes it possible to adjust a spike frequency adaptation behaviour by the capacitance of a capacitor CP and the drain-source resistances of transistors MG2 and MG5 which vary respectively with their gate voltages Vahp and Vlkahp. The operation of the circuit of FIG. 3 is analogous to that of the circuit described previously in FIG. 2.

FIGS. 2 and 3 are taken from the article “Neuromorphic silicon neuron circuits” by G. Indiveri et al. published in “Frontiers in Neuroscience”, 5, 2011.

However, the values of the parameters of artificial neurons using CMOS technology are not conserved in the event of powering off, which leads to a resetting of the value of the parameters. This poses a problem due to the fact that biological neurons store the value of their parameters in memory and, consequently, a bio-realistic neuron model should not be subject to the loss of information concerning the value of its parameters.

In addition, CMOS advanced nodes do not make it possible to adjust any value for a parameter, in particular they do not make it possible to reach high values of parameters when the leakage current becomes too high.

There thus exists a need to implement a programmable LIF type artificial neuron in a more efficient manner, without loss of information and enabling its parameters to take any value.

SUMMARY OF THE INVENTION

The invention offers a solution to the problems mentioned previously by making it possible to programme more efficiently the parameters of an artificial neuron while imposing no constraint on the value of these parameters and while limiting the loss of information.

A first aspect of the invention relates to a programmable artificial neuron emitting an output signal controlled by at least one control parameter, characterised in that it comprises, for each control parameter, a capacitor and at least one block associated with said control parameter, said block including:

- at least one multiplexer configured to be in two states: a programming state of said block and an operating state;
- a transistor; and
- a non-volatile resistive random access memory connected in series with said transistor, said capacitor and said non-volatile resistive random access memory being mounted in parallel;
- said multiplexer being configured to:
  - when it is in the programming state, set a resistance value of the non-volatile resistive random access memory, said value being chosen to set the value of the control parameter;
  - when it is in the operating state, conserve the set resistance value of the non-volatile resistive random access memory of the block.

Thanks to the invention, the use of a non-volatile resistive random access memory makes it possible to programme the value of the control parameters of the artificial neuron in a non-volatile manner, that is to say without resetting the value of the parameters in the event of powering off. In addition, the non-volatile resistive random access memories used within CMOS advanced nodes make it possible to adjust any value of parameter.

Apart from the characteristics that have been mentioned in the preceding paragraph, the programmable artificial neuron according to a first aspect of the invention may have one or more complementary characteristics among the following, considered individually or according to all technically possible combinations thereof.

Advantageously, the transistor is an MOS transistor.

Advantageously, the non-volatile resistive random access memory is an OxRAM, CBRAM or PCRAM type memory.

Thus, the programmable artificial neuron comprises any type of non-volatile resistive random access memory.

Advantageously, when the control parameter is a time constant, the artificial neuron comprises a block and a capacitor.

Advantageously, when the control parameter is a refractory period, the artificial neuron comprises a block and a capacitor.

Advantageously, when the control parameter is a spike frequency adaptation behaviour, the artificial neuron comprises two blocks and a capacitor.

Thus, the behaviour of the programmable artificial neuron is regulated by parameters regulating the behaviour of an LIF type artificial neuron.

A second aspect of the invention relates to a method for programming a programmable artificial neuron according to any of the preceding claims, characterised in that it comprises for each block, the following steps:

- Placing each multiplexer in a programming state;
- Setting the value of the drain-source resistance of the transistor;
- Adjusting the resistance value of the non-volatile resistive random access memory;
- Placing each multiplexer in an operating state.

Thus, the programming of each parameter of the programmable artificial neuron is carried out independently of the remainder of the circuit by placing each multiplexer of each block in the programming state.

The invention and its different applications will be better understood on reading the description that follows and by examining the figures that accompany it.

BRIEF DESCRIPTION OF THE FIGURES

The figures are presented for indicative purposes and in no way limit the invention.

DETAILED DESCRIPTION OF AT LEAST ONE EMBODIMENT OF THE INVENTION

Unless stated otherwise, a same element appearing in the different figures has a single reference.

In the remainder of the description, the terms "neuron", "artificial neuron" and "programmable artificial neuron" will be employed indiscriminately.

Figure 1:
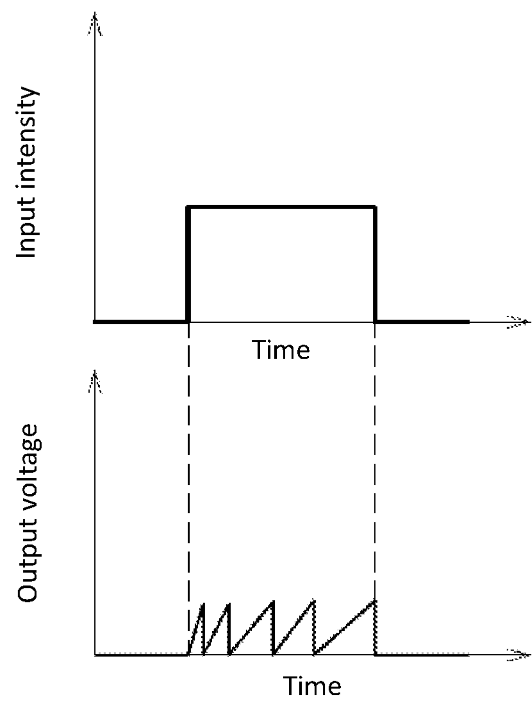
FIG. 1 of the prior art shows a graph representing the voltage at the output of an LIF type artificial neuron subjected at the input to a step intensity, illustrating the spike frequency adaptation behaviour.
Figure 2:
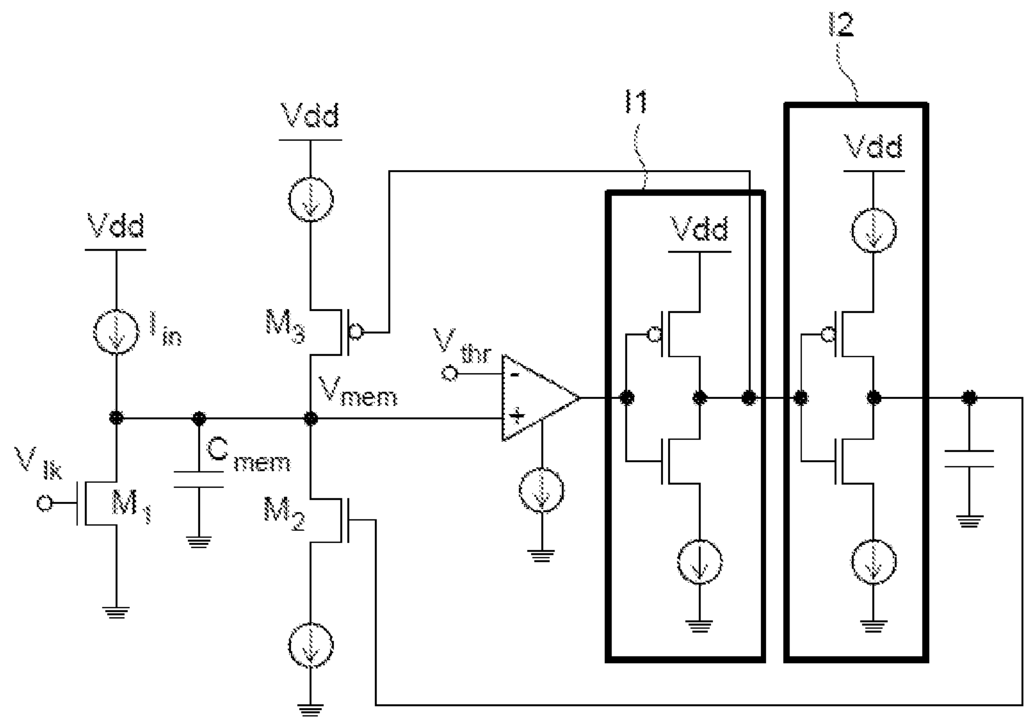
FIG. 2 of the prior art shows an LIF type artificial neuron implemented with CMOS technology, in which the value of a time constant is adjusted by the gate voltage Vlk of a transistor M1.
Figure 3:
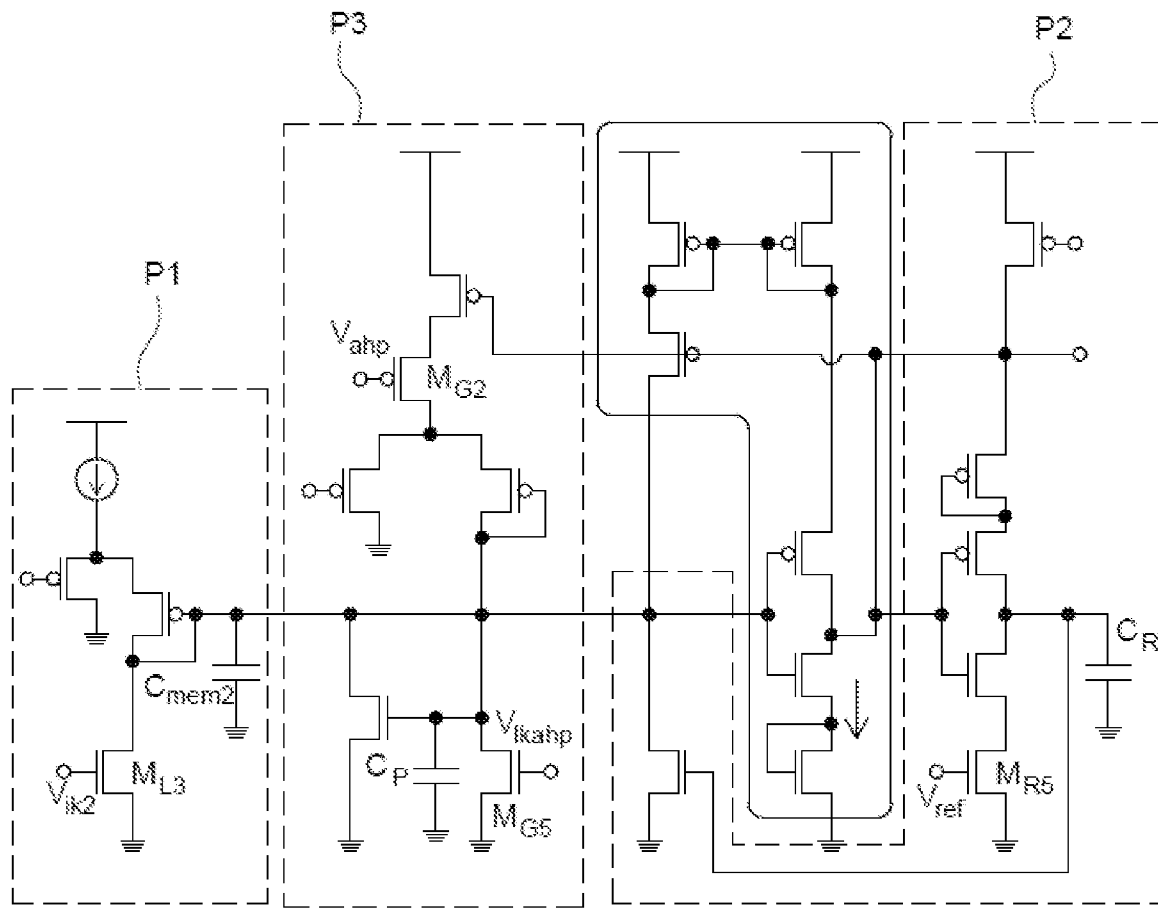
FIG. 3 of the prior art shows an LIF type artificial neuron implemented with CMOS technology, in which the value of a time constant is adjusted by the gate voltage Vlk2 of a transistor ML3, the value of a refractory period is adjusted by the gate voltage Vref of a transistor MR5 and the value of a spike frequency adaptation behaviour is adjusted by the gate voltage Vahp of a transistor MG2 and by the gate voltage Vlkahp of a transistor MG5.

FIGS. 1, 2 and 3 have already been described with reference to the prior art.

A first aspect of the invention relates to a programmable artificial neuron of which the behaviour is governed by several control parameters of which the values are programmable. "Programmable values" are taken to mean adjustable values, that is to say which can be modified.

The programmable artificial neuron is for example an LIF (Leaky Integrate and Fire) type neuron. The programmable artificial neuron may also be a neuron based on the Hodgkin-Huxley model or on the Izhikevich model.

Figure 4A:
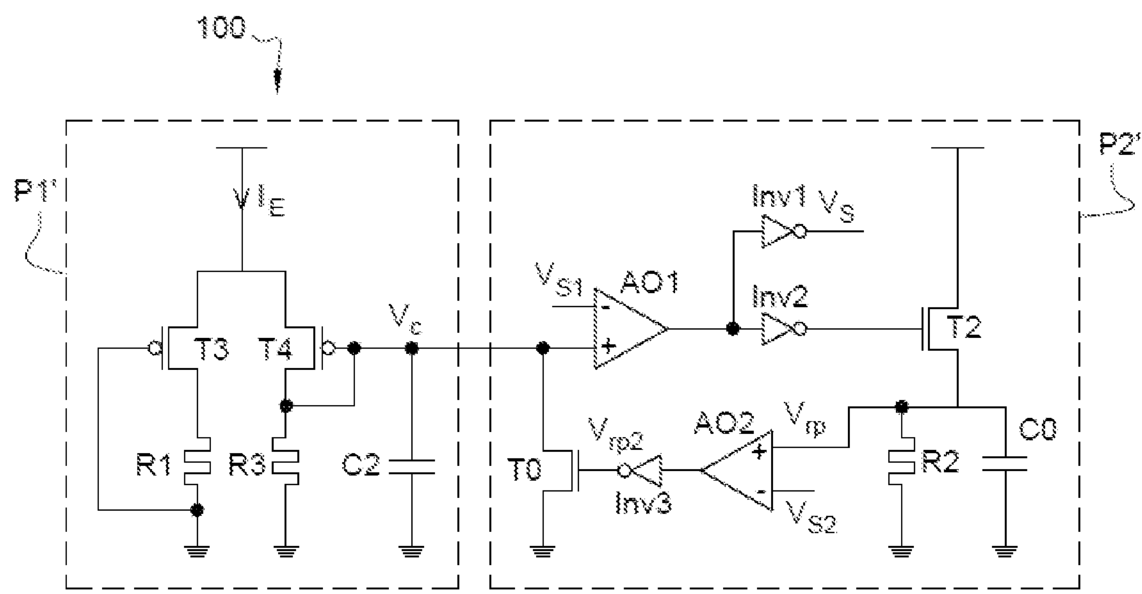
FIG. 4A shows an example of programmable LIF type artificial neuron according to a first aspect of the invention of which the output signal Vs is controlled by a time constant and a refractory period.

An example of programmable LIF type artificial neuron 100 is illustrated in FIG. 4A. The output signal Vs of the artificial neuron 100 illustrated in FIG. 4A is controlled by two control parameters, a time constant adjusted by a first part P1' of the artificial neuron 100 and a refractory period adjusted by a second part P2' of the artificial neuron 100.

The part P1' of the artificial neuron 100 comprises a current source IE supplying a node dividing into a first branch comprising a transistor T3 and a resistive random access memory R1 and into a second branch comprising a transistor T4 and a resistive random access memory R3, the first and second branches being connected in parallel.

In the first branch, the resistive random access memory R1 has a first end connected to earth and a second end connected to the drain of the transistor T3. The gate of the transistor T3 is connected to the first end of the resistive random access memory R1 and the source of the transistor T3 is connected to the node shared by the first and second branches.

In the second branch, the resistive random access memory R3 has a first end connected to earth and a second end connected to the source of the transistor T4. The gate of the transistor T4 is connected to the second end of the resistive random access memory R3 and the drain of the transistor T4 is connected to the node shared by the first and second branches.

A capacitor C2 is connected in parallel with the resistive random access memory R3. The capacitor C2 has a first end connected to earth and a second end connected to the gate of the transistor T4. The voltage at the terminals of the capacitor C2 is noted Vc.

The part P2' of the artificial neuron 100 comprises a first operational amplifier AO1 of which the non-inverting input is connected to the second end of the capacitor C2 of the part P1' and of which the inverting input is subjected to a first threshold voltage Vs1. The output of the first operational amplifier AO1 is connected to a first inverter Inv1 of which the output generates the output signal Vs and to a second inverter Inv2, the first and second inverters being connected in parallel.

The part P2' of the artificial neuron 100 also comprises a capacitor C0 having a first end connected to earth and a second end and a transistor T2 of which the gate is connected to the output of the second inverter Inv2, the source to a voltage generator, and the drain to the second end of the capacitor C0.

The part P2' of the artificial neuron 100 comprises a resistive random access memory R2 connected in parallel with the capacitor C0 having a first end connected to earth and a second end connected to the second end of the capacitor C0. The voltage at the terminals of the capacitor C0 is noted Vrp.

The part P2' of the artificial neuron 100 also comprises a second operational amplifier AO2 of which the non-inverting input is connected to the second end of the resistive random access memory R2*q* and of which the inverting input is supplied by a second threshold voltage Vs2.

The part P2' of the artificial neuron 100 comprises a transistor T0 and a third inverter Inv3, the input of the third inverter Inv3 being connected to the output of the second operational amplifier AO2 and the output of the third inverter Inv3 being connected to the gate of the transistor T0. The voltage at the output of the third inverter Inv3 is noted Vrp2.

The transistor T0 is connected in parallel with the capacitor C2, its source being connected to earth and its drain to the second end of the capacitor C2.

Figure 5:
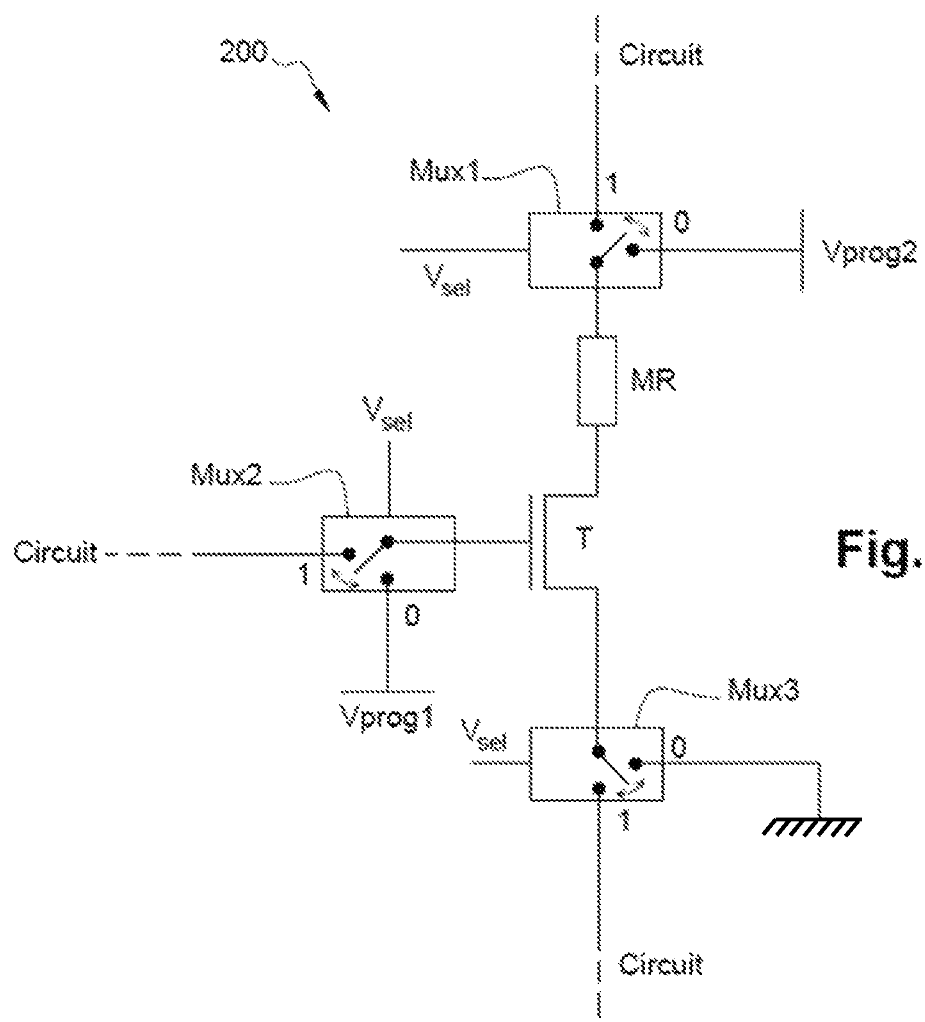
FIG. 5 shows a block making it possible to adjust the value of a control parameter of the programmable artificial neuron according to a first aspect of the invention.

Within the programmable artificial neuron 100, the value of each control parameter is programmable by means of a capacitor and at least one block 200 illustrated in FIG. 5.

A block 200 comprises a resistive random access memory MR having a first and a second end, a transistor T connected to the first end of the resistive random access memory MR and at least one multiplexer Mux.

The transistor T is for example a MOS transistor. The non-volatile resistive random access memory MR is for example an OxRAM, CBRAM or PCRAM memory.

A resistive random access memory has at least two states, a high resistance state and a low resistance state. The writing mechanism enabling the storage of information in the resistive random access memory is called SET and consists in passing from the high resistance state to the low resistance state by applying a voltage VSET or a current adapted to the resistive random access memory. To erase information, the active material is switched from the low resistance state to the high resistance state by applying a voltage VRESET or a current adapted to the resistive random access memory, the erasing mechanism being called RESET.

Several types of resistive random access memories exist:

- OxRAM (Oxide RAM) comprising an active zone based on an oxide-based active material;
- CBRAM (Conductive Bridging RAM) comprising an active zone based on an ion conducting material forming an ion conducting solid electrolyte arranged between an electrode forming an inert cathode and an electrode comprising a portion of ionisable metal forming an anode;
- PCRAM (Phase Change RAM) comprising a phase change material, typically a chalcogenide material arranged between a lower electrode and an upper electrode.

A multiplexer Mux has a selection input Vsel and two outputs, a first output corresponding to a programming state 0 and a second output to an operating state 1, the selection input making it possible to choose between the two outputs.

In the operating state 1, the multiplexer makes it possible to connect the block 200 to the remainder of the circuit constituting the programmable artificial neuron 100, that is to say electrically connect the block 200 to the artificial neuron 100 and in the programming state 0, it makes it possible to separate the block 200 from the remainder of the circuit constituting the artificial neuron 100, that is to say electrically disconnect the block 200 from the artificial neuron 100. Thus, the block 200 forms part of the artificial neuron 100 in the operating state 1 and is isolated from the remainder of the artificial neuron 100 in the programming state 0.

In FIG. 4A, the time constant is adjusted by the capacitor C2 and a block 200 comprising the transistor T4 and the resistive random access memory R3 and the refractory period is adjusted by the capacitor C0 and a block 200 comprising the transistor T2 and the resistive random access memory R2.

For the sake of simplicity, the multiplexers Mux are not represented in FIG. 4A. Thus, everything happens as if the multiplexers Mux were all in the operating state 1.

In FIG. 5, the block 200 comprises three multiplexers Mux1, Mux2 and Mux3.

The multiplexer Mux1 is connected to the second end of the resistive random access memory MR. When it is in the programming state 0, the multiplexer Mux1 is connected to a voltage source Vprog2 whereas when it is in the operating state 1, the multiplexer Mux1 is connected to the circuit constituting the artificial neuron 100.

The multiplexer Mux2 is connected to the gate of the transistor T. When it is in the programming state 0, the multiplexer Mux2 is connected to a voltage source Vprog1 whereas when it is in the operating state 1, the multiplexer Mux2 is connected to the circuit constituting the artificial neuron 100.

The multiplexer Mux3 is connected to the drain of the transistor T. When it is in the programming state 0, the multiplexer Mux3 is connected to earth whereas when it is in the operating state 1, the multiplexer Mux3 is connected to the circuit constituting the artificial neuron 100.

In the block 200, the transistor T has two main functions. Once the voltage VSET or the current SET has been applied to the resistive random access memory MR, the transistor T makes it possible to set the resistance value of the resistive random access memory MR through the value of its drain-source resistance set by the applied gate voltage.

The transistor T also makes it possible to limit the current passing through the resistive random access memory MR and transistor T assembly to protect the resistive random access memory MR during transitions between its high resistance state and its low resistance state. Indeed, in the case of a resistive random access memory of OxRAM type for example, the passage from the high resistance state and to the low resistance state is carried out by applying a sufficient voltage VSET to the terminals of the OxRAM resistive random access memory. The transition between the high resistance state and the low resistance state is very rapid and results in a sudden increase in the current when the voltage VSET is reached. This sudden increase in the current is not self-limiting, that is to say that if nothing is done to control this increase, the current is going to increase up to very high values likely to lead to a very considerable increase in the temperature and a destruction of the resistive random access memory MR. It is thus necessary to limit the increase in the current to a certain value in order to obtain a low resistance state while keeping an integral resistive random access memory. This current limitation is achieved by the addition of the transistor T in series while controlling the level of limitation by means of its gate voltage. The higher the gate voltage, the higher the saturation current. The transistor T thus acts as means for regulating the limitation of current of the resistive random access memory MR.

Thus, once the value of the drain-source resistance of the transistor T is set by the gate voltage Vprog1, the resistive random access memory MR is subjected to a programming voltage Vprog2 corresponding to the voltage VSET or to the current SET or to the voltage VRESET or to the current RESET to adjust the value of its resistance.

In the operating state 1, the value of a control parameter is then adjusted by the resistance value of the resistive random access memory MR of each block 200 making it possible to adjust the control parameter in question and by the capacitance value of the capacitor connected in parallel with the resistive random access memory MR, the resistance value of the resistive random access memory MR having been set in the programming state 0.

In FIG. 4A, the value of the time constant is set by the capacitor C2 and the block 200 comprising the transistor T4 and the resistive random access memory R3.

The input signal is modelled by the current source IE dividing up into the first branch comprising the transistor T3 and the resistive random access memory R1 and into the second branch comprising the block 200 making it possible to adjust the value of the time constant. The ratio of the resistance values of the resistive random access memories R1 and R3 makes it possible to adjust the sharing of current between the two branches.

The capacitor C2 charges at a rate depending on the resistance value of the resistive random access memory R3.

When the voltage Vc applied to the capacitor C2 is greater than the first threshold voltage Vs1, the output of the first operational amplifier AO1 increases triggering a pulse Vs at the output of the first inverter Inv1.

Figure 4B:
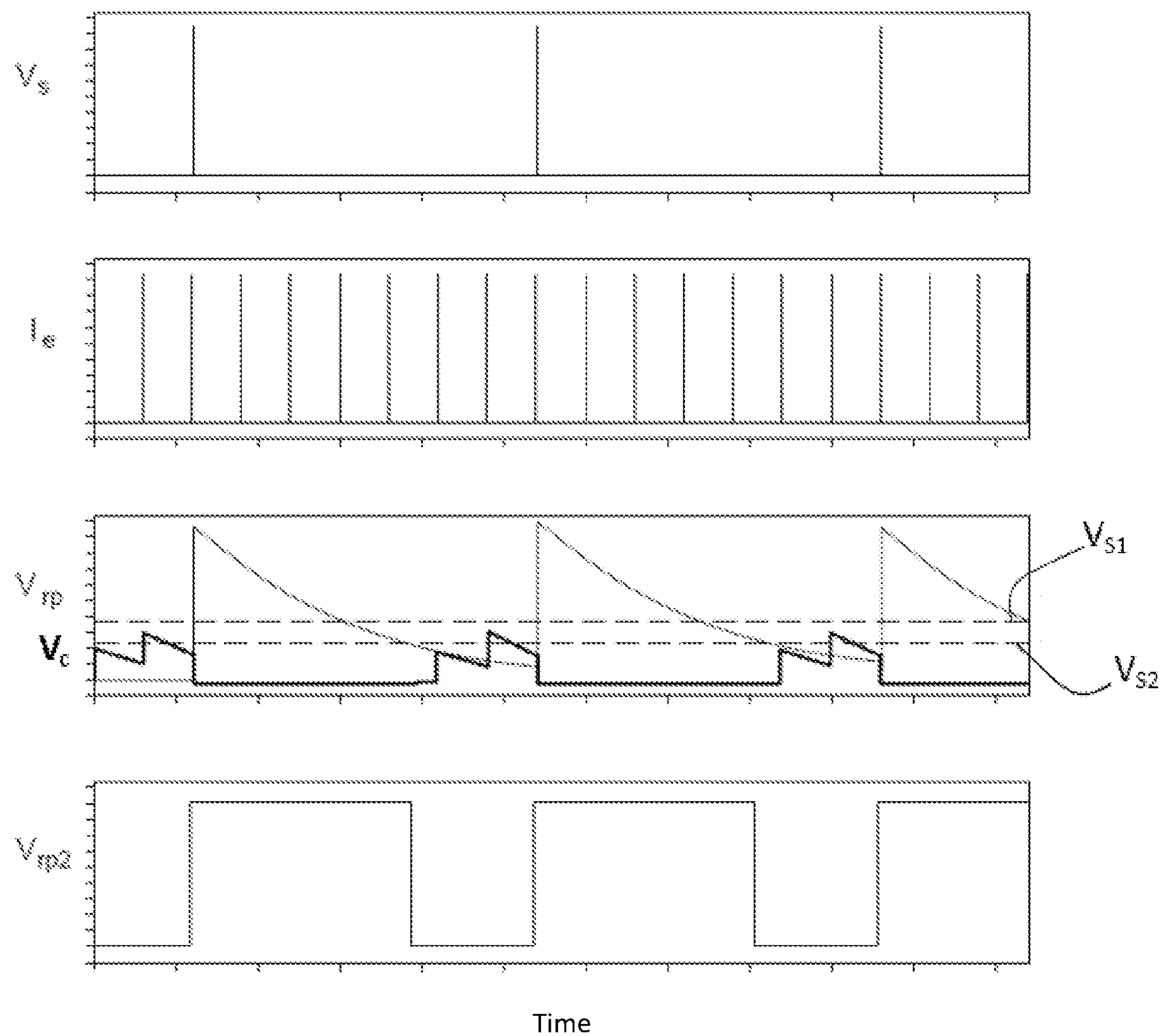
FIG. 4B represents, simultaneously as a function of time, a graph of the voltage at the output Vs, a graph of the intensity at the input IE, a graph of the voltage Vc at the terminals of a capacitor C2 making it possible to adjust the value of the time constant and the voltage Vrp at the terminals of a capacitor C0 making it possible to adjust the refractory period and a graph of the voltage Vrp2 supplying a transistor T0 of which the opening makes it possible to discharge the capacitor C2 for the programmable artificial neuron represented in FIG. 4A.

In FIG. 4B are represented, simultaneously and as a function of time, graphs of the output voltage Vs, the input intensity IE and the voltage Vc at the terminals of the capacitor C2.

The input intensity IE is a signal emitting periodically a same pulse.

Initially, the capacitor C2 is discharged. At the arrival of the first pulse at the input, the capacitor C2 charges instantaneously. Between the first and the second pulse, the capacitor C2 discharges into the resistive random access memory R3 without returning to zero. At the second pulse, the capacitor once again charges before discharging between the second and the third pulse. The voltage Vc at the terminals of the capacitor C2 during the second pulse is higher than the voltage Vc at the terminals of the capacitor C2 during the first pulse, in other words the capacitor C2 does not have the time to discharge completely between two pulses.

At the third pulse, the programmable artificial neuron 100 emits a pulse since the voltage Vc at the terminals of the capacitor C2 is greater than the first threshold voltage Vs1 which instantaneously leads to the complete discharge of the capacitor C2.

Thus, the value of the control parameter programmed by the capacitance value of the capacitor C2 and by the resistance value of the resistive random access memory R3 indeed corresponds to the rate at which the artificial neuron 100 charges before emitting a pulse, that is to say to the time constant of the LIF type artificial neuron.

In FIG. 4A, the value of the refractory period is set by the capacitor C0 and the block 200 including the transistor T2 and the resistive random access memory R2.

Simultaneously with the generation of the pulse Vs, the channel of the transistor M2 at the output of the second inverter Inv2 opens and the capacitor C0 charges at a rate depending on the resistance value of the resistive random access memory R2.

When the voltage Vrp at the terminals of the capacitor C0 is greater than the second threshold voltage Vs2, the output of the second operational amplifier AO2 increases and the voltage Vrp2 at the output of the third inverter Inv3 opens the channel of the transistor T0. The voltage Vc at the terminals of the capacitor C2 then discharges rapidly in such a way that the input voltage returns to zero. The pulse then ceases.

Once the pulse Vs has terminated, the capacitor C0 discharges into the resistance R2 which determines the discharge rate of the capacitor C0.

As long as the voltage Vrp at the terminals of the capacitor C0 is greater than the second threshold voltage Vs2, the channel of the transistor T0 is open and the capacitor C2 cannot charge, thereby limiting the emission of pulses.

In FIG. 4B are also represented, simultaneously and as a function of time, graphs of the voltage Vrp at the terminals of the capacitor C0 and the voltage Vrp2 supplying the gate of the transistor T0.

Simultaneously with the first pulse emitted by the programmable artificial neuron 100, the capacitor C0 charges and the voltage at its terminals exceeds the second threshold voltage Vs2. The channel of the transistor T0 then opens and the capacitor C2 discharges instantaneously.

Once the first pulse emitted by the programmable artificial neuron 100 has terminated, the capacitor C0 discharges into the resistive random access memory R2.

As long as the voltage Vrp at the terminals of the capacitor C0 does not go below the second threshold voltage Vs2, the channel of the transistor T0 is open and the capacitor C2 does not charge despite the pulses at the input.

Thus, up to the seventh pulse included, the voltage Vc at the terminals of the capacitor C2 remains zero.

Between the seventh and the eighth pulse at the input, the voltage Vrp at the terminals of the capacitor C0 passes below the second threshold voltage Vs2 and the channel of the transistor T0 closes.

At the eighth pulse, the capacitor C2 then charges once again while the capacitor C0 continues to discharge.

Thus, the value of the control parameter programmed by the capacitance value of the capacitor C0 and by the resistance value of the resistive random access memory R2 indeed corresponds to the minimum period between two pulse emissions, that is to say to the refractory period of the LIF type artificial neuron.

The refractory period may be seen in the graph of FIG. 4B illustrating the voltage Vrp2 supplying the transistor T0.

The circuit of FIG. 4A has a similar operation to a circuit which would only include the parts P1 and P2 of the circuit of FIG. 3, by replacing the transistor ML3 by the resistive random access memory R3 and the transistor MR5 by the resistive random access memory R2. Thus, those skilled in the art seeking to make a programmable artificial neuron of which the behaviour is also governed by a spike frequency adaptation behaviour would add the part P3 of the circuit of FIG. 3 to the circuit of FIG. 4A by replacing the transistors MG2 and MG5 by resistive random access memories. Two blocks 200 are thus necessary for the programming of the spike frequency adaptation behaviour.

Figure 6:
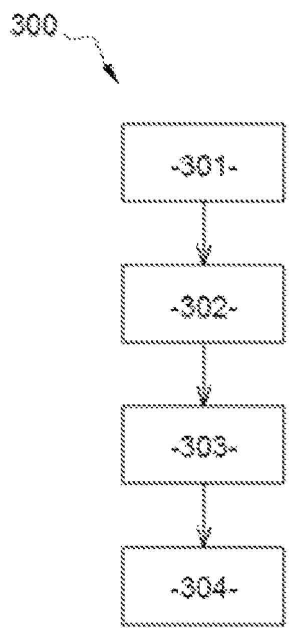
FIG. 6 shows a synoptic diagram of a programming method according to a second aspect of the invention.

A second aspect of the invention, illustrated in FIG. 6, relates to a method for programming 300 a programmable artificial neuron 100 according to a first aspect of the invention.

A first step 301 of the programming method 300 consists in placing each multiplexer Mux of each block 200 in a programming state 0 through the selection input Vsel.

Once the first step 301 has been carried out, each block 200 of the programmable artificial neuron 100 is isolated from the remainder of the circuit, that is to say electrically disconnected from the artificial neuron 100, and the gate of the transistor T of each block 200 is electrically connected to a voltage source and the resistive random access memory MR of each block 200 is electrically connected to a programming source.

A second step 302 of the programming method 300 consists in setting the value of the drain-source resistance of the transistor T of each block 200 by applying thereto a programming voltage Vprog1 with the voltage source in order to limit the current passing through the resistive random access memory MR and transistor T assembly.

A third step 303 of the programming method 300 next consists in programming the resistance value of the resistive random access memory MR of each block 200 with the programming source. To do so, the resistive random access memory MR is subjected to a programming voltage Vprog2 or to a current adapted to modify the value of its resistance.

At the end of the third step 303, the resistance value of the resistive random access memory MR is set at the desired value.

A fourth step 304 of the programming method 300 then consists in placing each multiplexer Mux in an operating state 1 through the selection input Vsel.

Once the fourth step 304 has been carried out, the blocks 200 of the programmable artificial neuron 100 are integrated in the artificial neuron 100, that is to say electrically connected to the artificial neuron 100 and the resistance value of each resistive random access memory MR is set at the desired value.

The control parameters of the programmable artificial neuron 100 are then programmed in a non-volatile manner.

The invention claimed is:

1. Programmable artificial neuron emitting an output signal controlled by at least one control parameter, comprising, for each control parameter of the at least one control parameter, a capacitor and at least one block associated with said control parameter of the at least one control parameter, said at least one block including:

at least one multiplexer configured to be in two states: a programming state of said at least one block and an operating state;

a transistor; and a non-volatile resistive random access memory connected in series with said transistor, said capacitor and said non-volatile resistive random access memory being mounted in parallel; said at least one multiplexer being configured to:

when it is in the programming state, electrically disconnect the at least one block from the programmable artificial neuron, electrically connect the gate of the transistor of the at least one block to a voltage source and electrically connect the resistive random access memory of the at least one block to a programming source;

when it is in the operating state, electrically connect the at least one block to the programmable artificial neuron.

2. The programmable artificial neuron according to claim 1, wherein the transistor is a MOS transistor.

3. The programmable artificial neuron according to claim 1, wherein the non-volatile resistive random access memory is an OxRAM, CBRAM or PCRAM type memory.

4. The programmable artificial neuron according to claim 1, wherein, when the control parameter of the at least one control parameter is a time constant, the programmable artificial neuron comprises one block and one capacitor.

5. The programmable artificial neuron according to claim 1, wherein, when the control parameter of the at least one control parameter is a refractory period, the programmable artificial neuron comprises one block and one capacitor.

6. The programmable artificial neuron according to claim 1, wherein, when the control parameter of the at least one control parameter is a spike frequency adaptation behaviour, the programmable artificial neuron comprises two blocks and one capacitor.

7. A method for programming a programmable artificial neuron according to claim 1, comprising for each block of the at least one block, the following steps:

electrically disconnecting the block from the programmable artificial neuron, electrically connecting the gate of the transistor of the block to a voltage source and electrically connecting the resistive random access memory of the block to a programming source by placing each multiplexer of the at least one multiplexer of the block in a programming state;

applying a voltage to the gate of the transistor of the block with the voltage source to set the value of the drain-source resistance of the transistor;

applying a programming voltage or a current with the programming source to adjust the resistance value of the non-volatile resistive random access memory of the block, and electrically connecting the block to the programmable artificial neuron by placing each multiplexer of the at least one multiplexer in an operating state.

* * * * *